(12) United States Patent
Cai et al.

(10) Patent No.: US 7,919,812 B2
(45) Date of Patent: Apr. 5, 2011

(54) PARTIALLY DEPLETED SOI FIELD EFFECT TRANSISTOR HAVING A METALLIZED SOURCE SIDE HALO REGION

(75) Inventors: Jin Cai, Cortlandt Manor, NY (US); Wilfried Haensch, Somers, NY (US); Amlan Majumdar, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/554,344

(22) Filed: Sep. 4, 2009

(65) Prior Publication Data

US 2009/0321831 A1   Dec. 31, 2009

Related U.S. Application Data

(62) Division of application No. 11/761,568, filed on Jun. 12, 2007, now Pat. No. 7,601,569.

(51) Int. Cl.
*H01L 21/70* (2006.01)
*H01K 29/60* (2006.01)
(52) U.S. Cl. .................. 257/336; 257/347; 257/348
(58) Field of Classification Search .............. 257/347, 257/348, 336, E29.278
See application file for complete search history.

(56) References Cited

U.S. PATENT DOCUMENTS

| | | | |
|---|---|---|---|
| 5,587,604 A | 12/1996 | Machesney et al. | |
| 6,177,708 B1 | 1/2001 | Kuang et al. | |
| 6,340,612 B1 | 1/2002 | Noble et al. | |
| 6,353,245 B1 | 3/2002 | Unnikrishnan | |
| 6,596,554 B2 * | 7/2003 | Unnikrishnan | 438/180 |
| 6,835,982 B2 | 12/2004 | Hogyoku | |
| 7,138,318 B2 | 11/2006 | Wu et al. | |

* cited by examiner

*Primary Examiner* — Long Pham
*Assistant Examiner* — Steven H Rao
(74) *Attorney, Agent, or Firm* — Scully, Scott, Murphy & Presser, P.C.; Vazken Alexanian (57) ABSTRACT

Source and drain extension regions and source side halo region and drain side halo region are formed in a top semiconductor layer aligned with a gate stack on an SOI substrate. A deep source region and a deep drain region are formed asymmetrically in the top semiconductor layer by an angled ion implantation. The deep source region is offset away from one of the outer edges of the at least spacer to expose the source extension region on the surface of the semiconductor substrate. A source metal semiconductor alloy is formed by reacting a metal layer with portions of the deep source region, the source extension region, and the source side halo region. The source metal semiconductor alloy abuts the remaining portion of the source side halo region, providing a body contact tied to the deep source region to the partially depleted SOI MOSFET.

14 Claims, 8 Drawing Sheets

PARTIALLY DEPLETED SOI FIELD EFFECT TRANSISTOR HAVING A METALLIZED SOURCE SIDE HALO REGION

CROSS-REFERENCE TO RELATED APPLICATIONS

This application is a divisional of U.S. patent application Ser. No. 11/761,568, filed Jun. 12, 2007, now U.S. Pat. No. 7,601,569

BACKGROUND

The present invention relates to semiconductor devices, and particularly, to partially depleted semiconductor-on-insulator (SOI) metal oxide semiconductor field effect transistors (MOSFETs) having a metallized source side halo region and methods of manufacturing the same.

On one hand, a metal oxide semiconductor field effect transistor (MOSFET) built on a silicon-on-insulator (SOI) substrate typically offers advantages over a MOSFET with comparable dimensions that is built on a bulk substrate by providing a higher on-current and lower parasitic capacitance between the body and other MOSFET components. On the other hand, a MOSFET built on an SOI substrate tends to have less consistency in the device operation due to "history effect," or "floating body effect," in which the potential of the body, and subsequently, the timing of the turn-on and the on-current of the SOI MOSFET are dependent on the past history of the SOI MOSFET. Furthermore, the level of leakage current also depends on the voltage of the floating body, which poses a challenge in the design of a low power SOI MOSFET.

The body of an SOI MOSFET stores charge which is dependent on the history of the device, hence becoming a "floating" body. As such, SOI MOSFETs exhibit threshold voltages which are difficult to anticipate and control, and which vary in time. The body charge storage effects result in dynamic sub-threshold voltage (sub-Vt) leakage and threshold voltage (Vt) mismatch among geometrically identical adjacent devices.

One exemplary semiconductor device in which the floating body effects in SOI MOSFETs are particularly a concern is static random access memory (SRAM) cells, in which Vt matching is extremely important as operating voltages continue to scale down. The floating body also poses leakage problems for pass gate devices. Another exemplary semiconductor device in which the floating body effects are a concern is stacked SOI MOSFET structures, as used in logic gates, in which the conductive state of SOI MOSFET devices higher up in the stack are strongly influenced by stored body charge, resulting in reduced gate-to-source voltage (Vgs) overdrive available to these devices. Yet other exemplary semiconductor devices in which control of the floating body effects is critical are sense amplifiers for SRAM circuits and current drivers in a current mirror circuit.

Figure 1:
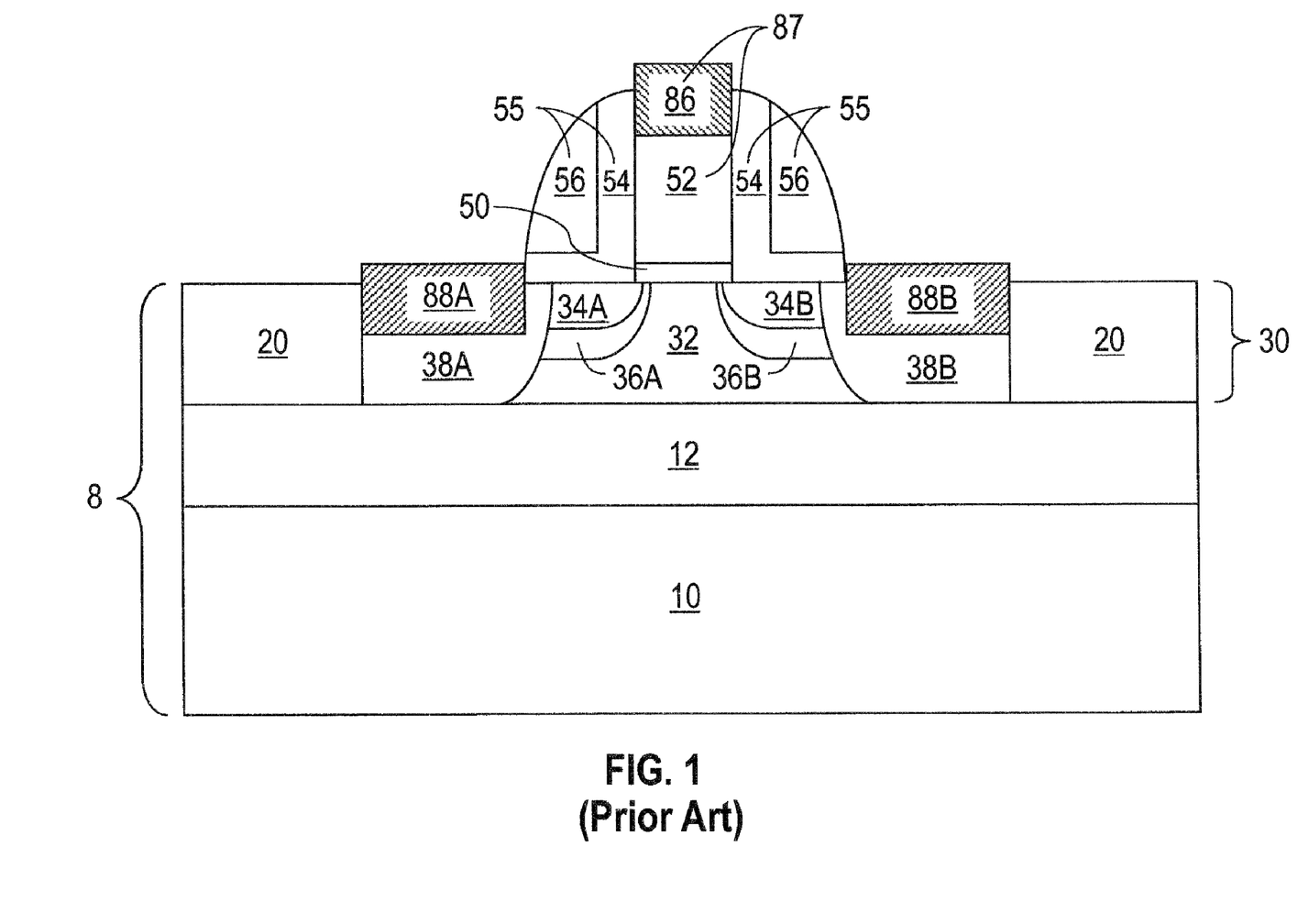
FIG. 1 is a vertical cross-sectional view of an exemplary prior art SOI MOSFET structure.

Referring to FIG. 1, a vertical cross-sectional view of an exemplary prior art SOI MOSFET comprises a semiconductor substrate 8 containing a handle substrate 10, a buried insulator layer 12, and a top semiconductor layer 30. The top semiconductor layer 30 comprises shallow trench isolation 20, a body 32, a deep source region 38A, a deep drain region 38B, a source extension region 34A, a drain extension region 34B, a source side halo region 36A, a drain side halo region 36B, a source metal semiconductor alloy 88A, and a drain metal semiconductor alloy 88B. The shallow trench isolation 20 comprises a dielectric material such as silicon oxide, and laterally surrounds other components of the exemplary prior art SOI MOSFET in the top semiconductor layer 30. The top semiconductor layer 30 excluding the shallow trench isolation 20 and the source metal semiconductor alloy 88A and the drain metal semiconductor alloy 88B comprises a semiconductor material. The source and drain extension regions (34A, 34B) and the source side halo region 36A and the drain side halo region 36B are disjoined from the source metal semiconductor alloy 88A and the drain metal semiconductor alloy 88B.

A gate dielectric 50 is located directly on a portion of the top semiconductor layer 30. A gate electrode 87 abutting the gate dielectric 50 comprises a gate conductor 52 and a gate metal semiconductor alloy 86. At least one gate spacer 55 abuts sidewalls of the gate electrode 87. The at least one gate spacer 55 may comprise a first gate spacer 54 and a second gate spacer 56. The source extension region 34A and the drain extension region 34B are aligned to the sidewalls of the gate electrode 87 and overlaps the gate electric 50 located underneath the gate electrode 87. The source side halo region 36A and the drain side halo region 36B also contact the gate dielectric 50. The body 32, the source side halo region 34A, and the drain side halo region 34B are doped with a first conductivity type doping, which may be p-type doping or n-type doping. The source side halo region 34A and the drain side halo region 34B have a higher doping concentration than the body 32. The deep source region 38A and the deep drain region 38B are doped with a second conductivity doping, which is the opposite of the first conductivity type doping.

The body 32 of the prior art exemplary SOI MOSFET is not electrically connected to the deep source region 38A. The body 32 is, therefore, electrically floating during operation of the prior art exemplary SOI MOSFET. Device characteristics of the prior art exemplary SOI MOSFET suffers from the floating body effects described above.

Methods of reducing floating body effects by incorporating body contacts tied to the source of a partially depleted SOI MOSFET have been proposed to improve performance of the SOI MOSFET. However, prior art methods of tying the body of a partially depleted SOI MOSFET to the source tend to require additional processing steps such as lithographic patterning of an implant area and ion implantation. In addition, the prior art methods also tend to produce inefficient layout due to an additional component to be formed in the SOI MOSFET as well as increased parasitic capacitance due to the presence of the additional component. Thus, the challenge in forming a body contacted SOI MOSFET is to do so without degrading its positive attributes, such as high immunity to short channel effects, steep sub-Vt slope, and high current drive capability due to volume inversion.

In view of the above, there exists a need for a partially depleted semiconductor-on-insulator (SOI) MOSFET having a body electrically tied to the source, while not suffering from adverse effects of prior art body contacted SOI MOSFETs such as requirement for additional processing steps, increased device layout size, and increased parasitic capacitance, and methods of manufacturing such a partially depleted SOI MOSFET.

BRIEF SUMMARY

The present invention addresses the needs described above by providing a partially depleted SOI MOSFET structure having a metallized source side halo region and methods of manufacturing the same.

According to the present invention, a gate stack and at least one gate spacer are formed on a top semiconductor layer of a semiconductor-on-insulator substrate, while source and drain extension regions and source side halo region and drain side halo region are formed in the top semiconductor layer aligned with the gate stack. A deep source region and a deep drain region are formed asymmetrically in the top semiconductor layer by an angled ion implantation employing the gate stack and the at least one gate spacer as an implantation mask. The deep source region is offset away from one of the outer edges of the at least spacer to expose the source extension region on the surface of the semiconductor substrate. A portion of the deep drain region is covered by the at least one gate spacer. A source metal semiconductor alloy is formed by reacting a metal layer with portions of the deep source region, the source extension region, and the source side halo region. The source metal semiconductor alloy abuts the remaining portion of the source side halo region, providing a body contact tied to the deep source region to the partially depleted SOI MOSFET.

According to an aspect of the present invention, a semiconductor structure is provided, which comprises:

a semiconductor-on-insulator (SOI) substrate containing a handle substrate, a buried insulator layer, and a top semiconductor layer;

a gate electrode located on the top semiconductor layer;

at least one gate spacer laterally abutting the gate electrode and vertically abutting the top semiconductor layer;

a deep source region vertically abutting the buried insulator layer and laterally offset from an outer edge of the at least one gate spacer away from the gate electrode;

a source side halo region located within the top semiconductor layer and abutting the deep source region; and a source metal semiconductor alloy vertically abutting the deep source region and the source side halo region.

In one embodiment, the source side halo region is disjoined from the buried insulator layer.

In another embodiment, the semiconductor structure further comprises a source extension region located in the top semiconductor layer and abutting the at least one gate spacer, the source side halo region, the deep source region, and the source metal semiconductor alloy.

In yet another embodiment, the top semiconductor layer comprises silicon and the source metal semiconductor alloy comprises a metal silicide.

In still another embodiment, the semiconductor structure further comprises:

a deep drain region vertically abutting the buried insulator layer and abutting the at least one gate spacer;

a drain side halo region located within the top semiconductor layer and abutting the deep drain region; and a drain metal semiconductor alloy vertically abutting the deep drain region and disjoined from the drain side halo region.

In still yet another embodiment, the semiconductor structure further comprises a drain extension region located in the top semiconductor layer and abutting the at least one gate spacer, the drain side halo region, and the deep drain region and disjoined from the drain metal semiconductor alloy.

In a further embodiment, the semiconductor structure further comprises a gate dielectric abutting the gate electrode, the gate spacer, the source extension region, the gate extension region, the source side halo region, and the drain side halo region.

In an even further embodiment, the gate electrode comprises a gate metal semiconductor alloy, wherein the source metal semiconductor alloy and the drain metal semiconductor alloy have the same composition, and the gate metal semiconductor alloy, the source metal semiconductor alloy, and the drain metal semiconductor alloy are metal semiconductor alloys derived from the same metal.

In an even further embodiment, the semiconductor structure further comprises a body located in the top semiconductor layer, abutting the buried insulator layer, and having a first conductivity type doping at a doping concentration from about $1.0 \times 10^{15}$ atoms/cm$^3$ to about $1.0 \times 10^{19}$/cm$^3$, wherein the deep source region has a second conductivity type doping at a doping concentration from about $3.0 \times 10^{19}$ atoms/cm$^3$ to about $3.0 \times 10^{21}$ atoms/cm$^3$, and the source side halo region has the first conductivity type doping at a doping concentration from about $1.0 \times 10^{17}$ atoms/cm$^3$ to about $1.0 \times 10^{20}$ atoms/cm$^3$, and wherein the second conductivity type is the opposite of the first conductivity type.

In a yet further embodiment, the top semiconductor layer has a thickness from about 30 nm to about 200 nm, the source side halo region has a depth, as measured from a top surface of the top semiconductor layer, from about 20 nm to about 180 nm, and the source metal semiconductor alloy has a thickness from about 15 nm to about 60 nm.

According to another aspect of the present invention, a semiconductor-on-insulator (SOI) metal-oxide-semiconductor field effect transistor (MOSFET) structure is provided, which comprises:

a semiconductor-on-insulator (SOI) substrate containing a handle substrate, a buried insulator layer, and a top semiconductor layer;

a gate dielectric vertically abutting a portion of the top semiconductor layer;

a gate electrode vertically abutting the gate dielectric;

at least one gate spacer laterally abutting the gate electrode and vertically abutting the top semiconductor layer;

a body located in the top semiconductor layer and vertically abutting the gate dielectric and having a first conductivity type doping;

a deep source region vertically abutting the buried insulator layer, laterally offset from an outer edge of the at least one gate spacer away from the gate electrode, and having a second conductivity type doping, wherein the second conductivity type is the opposite of the first conductivity type;

a deep drain region abutting the buried insulator layer and the at least one gate spacer and having the second conductivity type doping;

a source extension region located in the top semiconductor layer and abutting the at least one gate spacer and disjoined from the deep source region and having the second conductivity type doping;

a drain extension region located in the top semiconductor layer and abutting the at least one gate spacer and the deep drain region and having the second conductivity type doping;

a source side halo region located within the top semiconductor layer, abutting the deep source region, the source extension region, the gate dielectric, and the body, and having the first conductivity type doping;

a drain side halo region located within the top semiconductor layer, abutting the deep drain region, the drain extension region, the gate dielectric, and the body, and having the first conductivity type doping;

a source metal semiconductor alloy abutting the deep source region, the source side halo region, and the source extension region; and a drain metal semiconductor alloy abutting the deep drain region and disjoined from the drain side halo region and the drain extension region.

According to yet another aspect of the present invention, a method of forming a semiconductor structure is provided, which comprises:

providing a semiconductor-on-insulator substrate having a top semiconductor layer;

forming a gate conductor on the top semiconductor layer;
forming a source side halo region and drain side halo region in the top semiconductor layer;
forming at least one gate spacer on the gate conductor; and
forming a deep source region and a deep drain region in the top semiconductor layer by angled ion implantation, wherein the deep source region is formed offset away from an edge of the at least one gate spacer away and the deep drain region is formed directly on the at least one gate spacer.

DETAILED DESCRIPTION

As stated above, the present invention relates to partially depleted semiconductor-on-insulator (SOI) metal oxide semiconductor field effect transistors (MOSFETs) having a metallized source side halo region and methods of manufacturing the same, which are now described in detail with accompanying figures. It is noted that like and corresponding elements are referred to by like reference numerals.

Figure 2:
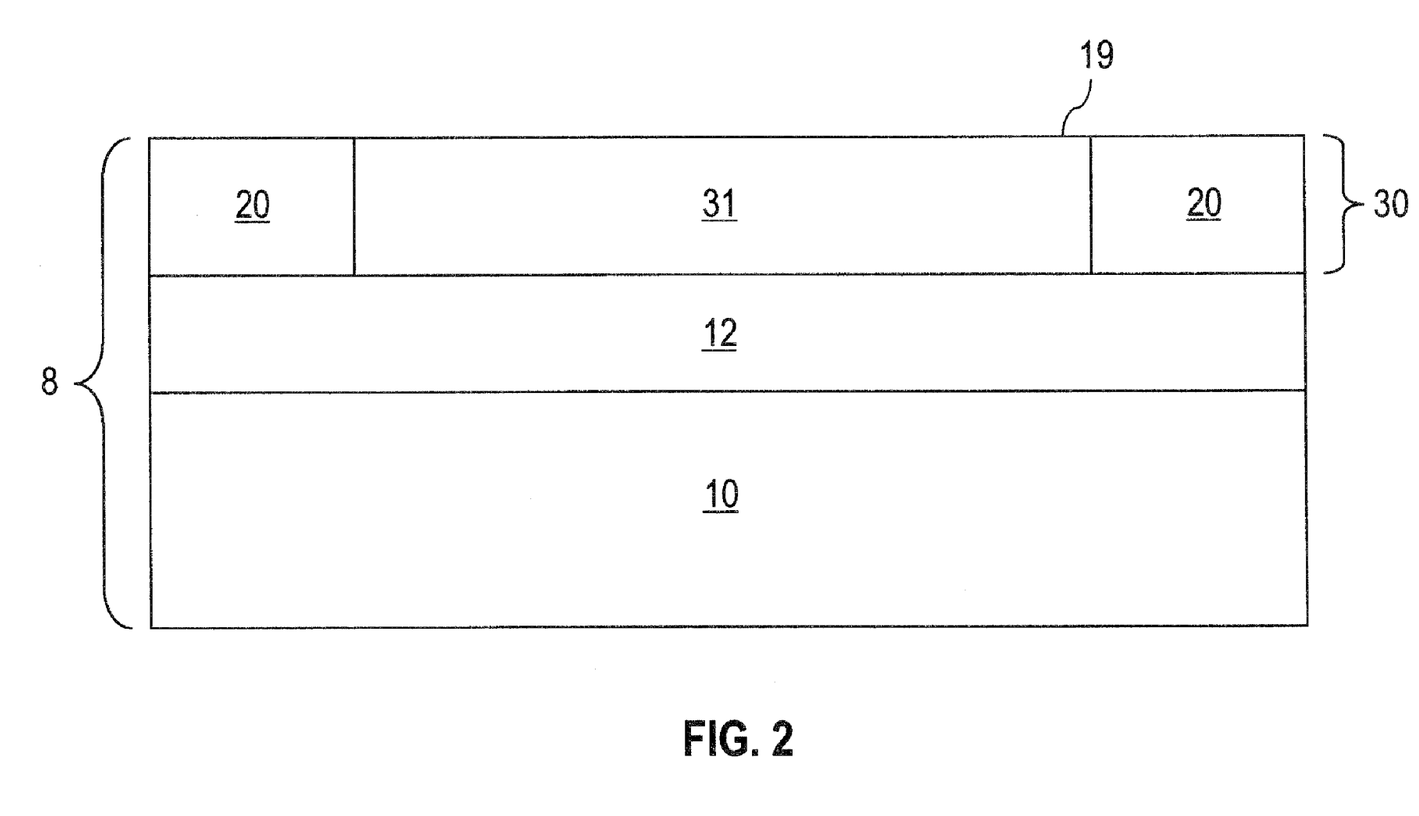
FIGS. 2-8 are sequential vertical cross-sectional views of an exemplary SOI MOSFET according to the present invention.

Referring to FIG. 2, an exemplary semiconductor structure comprises a semiconductor-on-insulator (SOI) metal-oxide-semiconductor field effect transistor (MOSFET) structure according to the present invention. The inventive SOI MOSFET comprises an SOI substrate 8 containing a handle substrate 10, a buried insulator layer 12, and a top semiconductor layer 30. The top semiconductor layer 30 contains shallow trench isolation 20 comprising a dielectric material and a semiconductor region 31 comprising a semiconductor material. The shallow trench isolation 20 abuts the buried insulator layer 12 and laterally surrounds the semiconductor region 31 so that the semiconductor region is electrically isolated from other semiconductor regions (not shown) formed in the top semiconductor layer 30.

Preferably, the semiconductor region 31 comprises a single crystalline semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. In an exemplary embodiment, the semiconductor material comprises silicon. The semiconductor region 31 may be doped with electrical dopants of a first conductivity type. The electrical dopants may be at least one of p-type dopants such as B, Ga, and In. Alternately, the electrical dopants may be at least one of n-type dopants such as P, As, and Sb. The concentration of the electrical dopants may be from about $1.0 \times 10^{15}$ atoms/cm$^3$ to about $1.0 \times 10^{19}$ atoms/cm$^3$. Non-electrical stress-generating dopants such as Ge and/or C may also be present.

The semiconductor region 31 may have a built-in biaxial stress in the plane of the semiconductor region 31, i.e., in the plane perpendicular to the direction of the surface normal of a top surface 19 of the semiconductor region 31. While the present invention is described with the exemplary SOI MOSFET formed on an SOI substrate, the present invention may be implemented on a bulk substrate or on a hybrid substrate. Such variations are explicitly contemplated herein.

Figure 3:
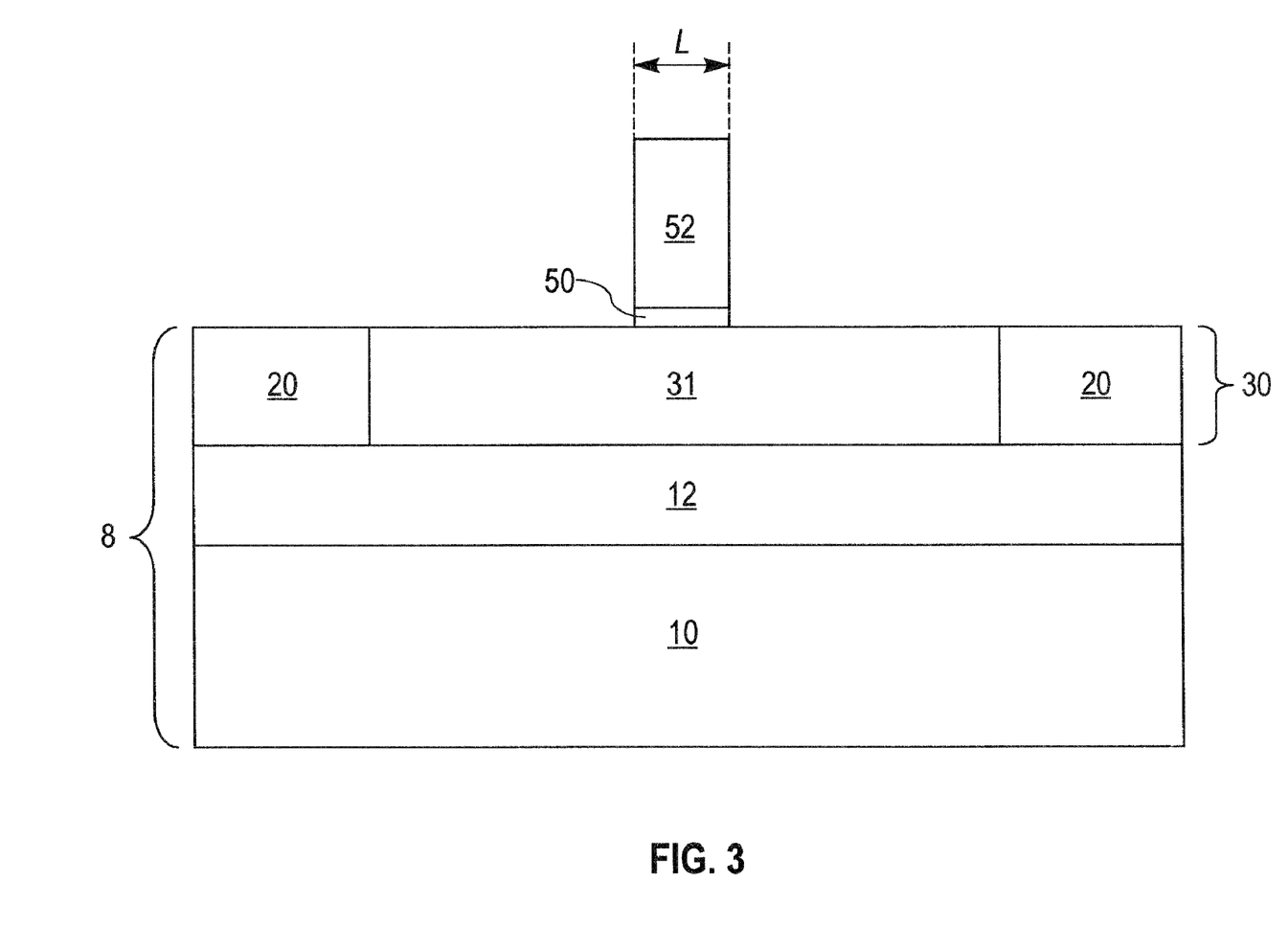

Referring to FIG. 3, a gate dielectric 50 and a gate conductor 52 are formed on the semiconductor region 31. Specifically, a stack of a gate dielectric layer (not shown) and a gate conductor layer (not shown) is formed on the semiconductor region 31 and lithographically patterned and etched. The gate dielectric layer, and consequently the gate dielectric 50, may comprise a conventional dielectric material such as silicon oxide, silicon nitride, silicon oxynitride, and/or a stack thereof. The conventional dielectric material may be formed by thermal conversion of a top portion of the semiconductor region 31 and/or by chemical vapor deposition (CVD). Alternately, the gate dielectric layer may comprise a high-k dielectric material such as $HfO_2$, $ZrO_2$, $La_2O_3$, $Al_2O_3$, $TiO_2$, $SrTiO_3$, $LaAlO_3$, $Y_2O_3$, an alloy thereof, and a silicate thereof. The high-k dielectric material may be formed by methods well known in the art including, for example, a chemical vapor deposition (CVD), an atomic layer deposition (ALD), molecular beam epitaxy (MBE), pulsed laser deposition (PLD), liquid source misted chemical deposition (LSMCD), physical vapor deposition (PVD), etc. The thickness of the gate dielectric layer may be from about 1 nm to about 3 nm in the case of a conventional dielectric material, and from about 2 nm to about 6 nm in the case of the high-k dielectric material, and may have an effective oxide thickness on the order of or less than 1 nm.

The gate conductor layer, and consequently the gate conductor 52, may comprise a semiconductor gate layer and/or a metal gate layer. In the case of the gate dielectric 50 comprising a conventional dielectric material, the gate conductor 52 typically comprises a semiconductor gate layer and has a thickness from about 40 nm to about 200 nm. In the case of the gate dielectric comprising a high-k dielectric material, the gate conductor 52 may comprise a metal gate layer abutting the gate dielectric 50. The metal gate layer may comprise a conductive refractory metal nitride. For example, the metal gate layer may comprise a material such as TaN, TiN, WN, TiAlN, TaCN, other conductive refractory metal nitride, or an alloy thereof. The thickness of the metal gate layer may be from about 2 nm to about 100 nm, and preferably from about 7 nm to about 50 nm. The gate conductor 52 may comprise a stack of a metal gate layer and a semiconductor gate layer. Other materials may be employed for the gate dielectric 50 and/or the gate conductor 52 in addition to the materials described above.

The length L of the gate conductor 52 may be determined by lithographic means, and may be a lithographic minimum length, or a "critical dimension." A trimming etch may be employed to reduce the length L of the gate conductor 52 to a length less than the lithographic minimum length as needed.

Figure 4:
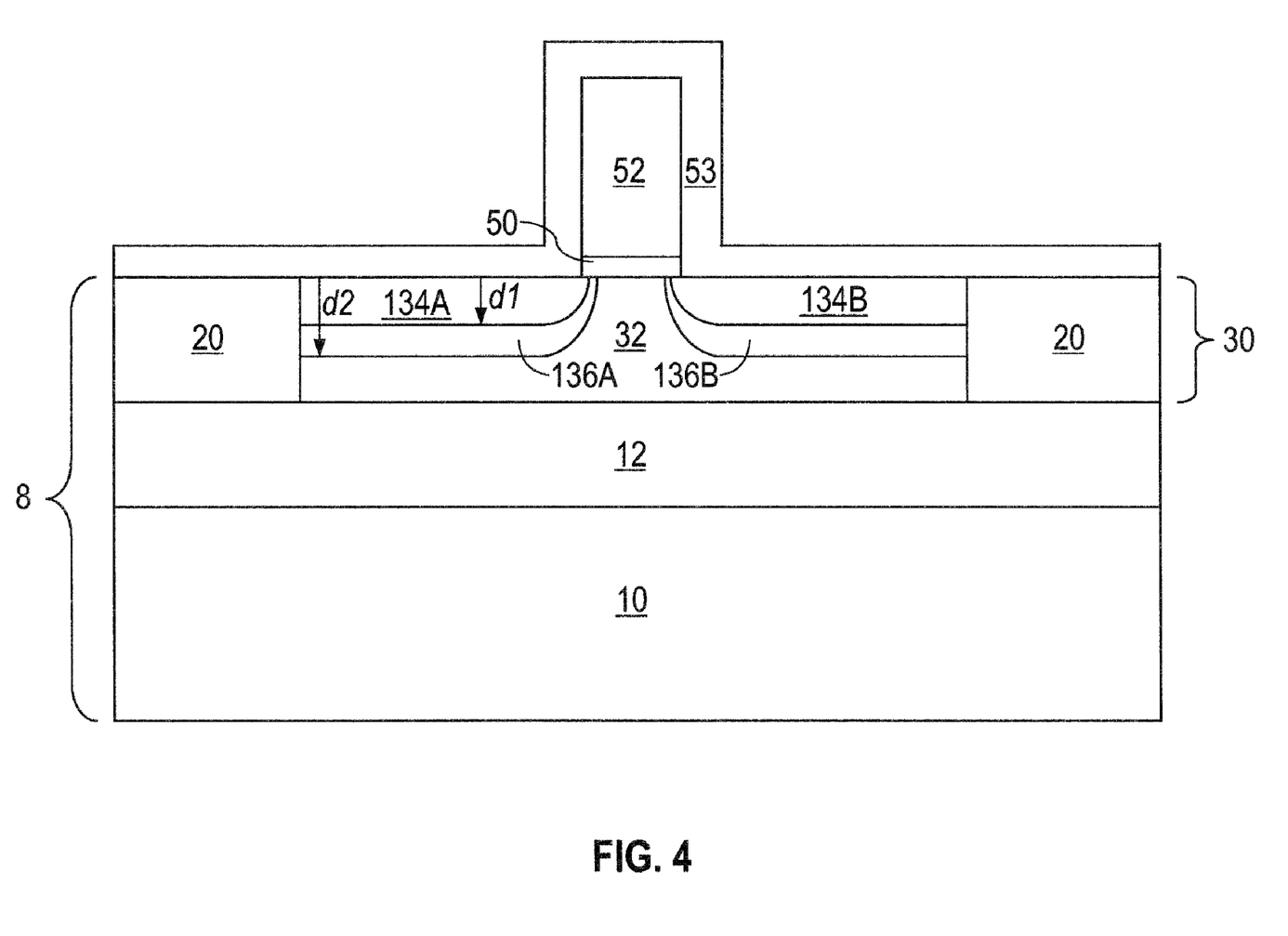

Referring to FIG. 4, a first gate spacer layer 53 comprising a dielectric material such as silicon oxide may be formed on the gate conductor 52 and the top semiconductor layer 30. Ion implantations are performed into the top semiconductor layer 30 employing the gate conductor 52 as an implantation mask to form a source extension region 134A, a drain extension region 134B, a source side halo region 136A, and a drain side halo region 136B, all of which are self-aligned to the gate conductor 52. Typically, the source extension region 134A and the drain extension region 134B are formed in the top semiconductor layer 30 during a same processing step. Similarly, the source side halo region 136A and the drain side halo region 136B are formed in the top semiconductor region 30 during another same processing step. The ion implantation step for formation of the source extension region 134A and the drain extension region 134B may be performed prior to, or after, the formation of the first gate spacer layer 53. Similarly, the ion implantation step for formation of the source side halo region 136A and the drain side halo region 136B may be performed prior to, or after, the formation of the first gate spacer layer 53. In case an ion implantation step follows formation of the first gate spacer layer 53, vertical portions of the first gate spacer layer 53 on sidewalls of the gate conductor 52 also serve as an implantation mask. In a variation of the exemplary SOI MOSFET structure, the first gate spacer layer 53 may be omitted, and the ion implantation steps follow formation of the gate conductor 52.

The portion of the semiconductor region 31 (see FIG. 3) that is not implanted with dopant ions during the ion implantation steps for the formation of the source extension region 134A, the drain extension region 134B, the source side halo region 136A, and the drain side halo region 136B constitutes a body 32 of the exemplary SOI MOSFET structure having the first conductivity type doping. The source extension region 134A and the drain extension region 134B has a first depth d1 which may be from about 5 nm to about 50 nm, although lesser and greater depths are also contemplated herein. The source side halo region 136A and the drain side halo region 136B has a second depth d2 which is greater than the first depth d1 and may be from about 10 nm to about 100 nm, although lesser and greater depths are also contemplated herein. An outer edge of the source extension region 134A extends under the gate dielectric 50 so that the source extension region 134A abuts the gate dielectric 50. Similarly, the drain extension region 134B abuts the gate dielectric 50. An outer edge of the source side halo region 136A extends under the gate dielectric 50 farther than the source extension region 134A so that the source side halo region 136A abuts the gate dielectric 50. Similarly, the drain side halo region 136B abuts the gate dielectric 50. The source extension region 134A and the gate extension region 134B are disjoined from the body 32 with either the source side halo region 136A or the drain side halo region 136B in between.

The source extension region 134A and the drain extension region 134B have a second conductivity type doping, which is the opposite of the first conductivity type doping. In other words, in case the body 32 has p-type doping, the source extension region 134A and the drain extension region 134B have n-type doping and vice versa. The source extension region 134A and the drain extension region 134B may have a doping concentration from about $1.0 \times 10^{19}$ atoms/cm$^3$ to about $1.0 \times 10^{21}$ atoms/cm$^3$, while lesser and greater doping concentrations are also contemplated herein. The source side halo region 136A and the drain side halo region 136B have the first conductivity doping. Typical doping concentration of the source side halo region 136A and the drain side halo region 136B may be from about $1.0 \times 10^{17}$ atoms/cm$^3$ to about $1.0 \times^{20}$ atoms/cm$^3$, while lesser and greater doping concentrations are also contemplated herein.

Figure 5:
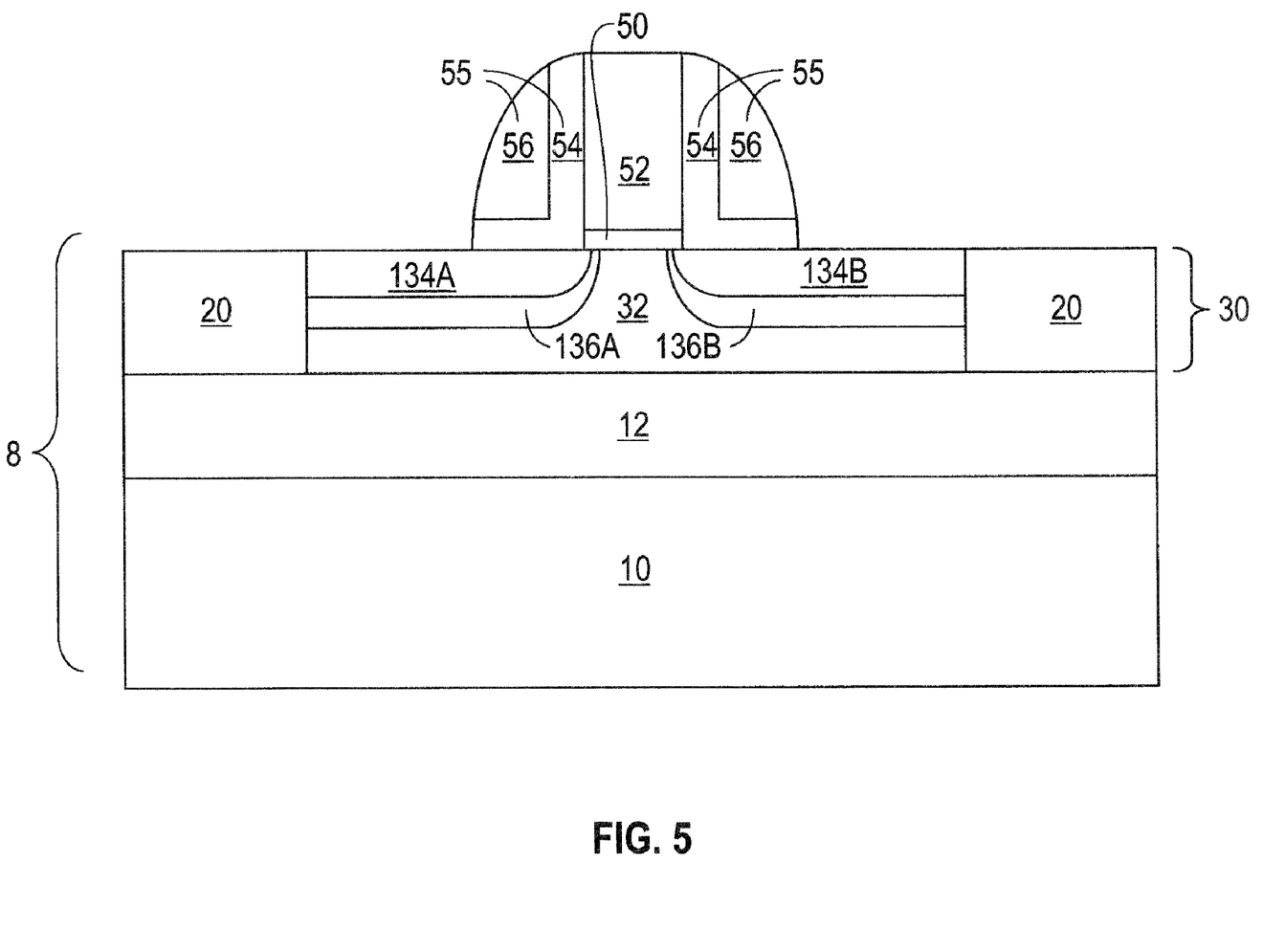

Referring to FIG. 5, a second gate spacer layer (not shown) is deposited on the first gate spacer layer and etched in a reactive ion etch processing step to form a second gate spacer 56. The second gate spacer 56 comprises a dielectric material that may, or may not, be the same as the dielectric material of the first gate spacer 54. For example, the first gate spacer 54 may comprise silicon oxide and the second gate spacer 56 may comprise silicon nitride material. The portions of the first gate spacer layer 53 outside the outer sidewalls of the second gate spacer 56 are removed during the reactive ion etch. The remaining portion of the first gate spacer layer 53 constitutes a first gate spacer 54. The first gate spacer 54 may be L-shaped since the first gate spacer 54 is formed directly on the top semiconductor layer 30 and the sidewalls of the gate conductor 52, while the second gate spacer 56 is formed directly on the first gate spacer 54 and is separated from the top semiconductor layer 30 and the sidewalls of the gate conductor 52 by the first gate spacer 54. The dielectric materials for the first and second gate spacers may include a low-k dielectric material.

The first gate spacer 54 and the second gate spacer 56 collectively form at least one gate spacer 55. In the variation of the exemplary SOI MOSFET structure in which the first gate spacer 54 is omitted, the second gate spacer 56 laterally abuts sidewalls of the gate conductor 52, and the second gate spacer 56 is the at least one gate spacer 55. In general, the at least one gate spacer 55 laterally abuts sidewalls of the gate conductor 52 and the gate dielectric 50. In addition, the at least one gate spacer 55 vertically abuts the source extension region 134A and the drain extension region 134B.

The thickness of the at least one gate spacer 55, as measured laterally at the base of the at least one gate spacer 55 from the sidewall of the gate conductor 52 abutting the at least one gate spacer 55 to an outer edge of the at least one gate spacer 55 adjoining either the source extension region 134A or the drain extension region 134B, may be from about 10 nm to about 100 nm, and typically from about 20 nm to about 80 nm.

Figure 6:
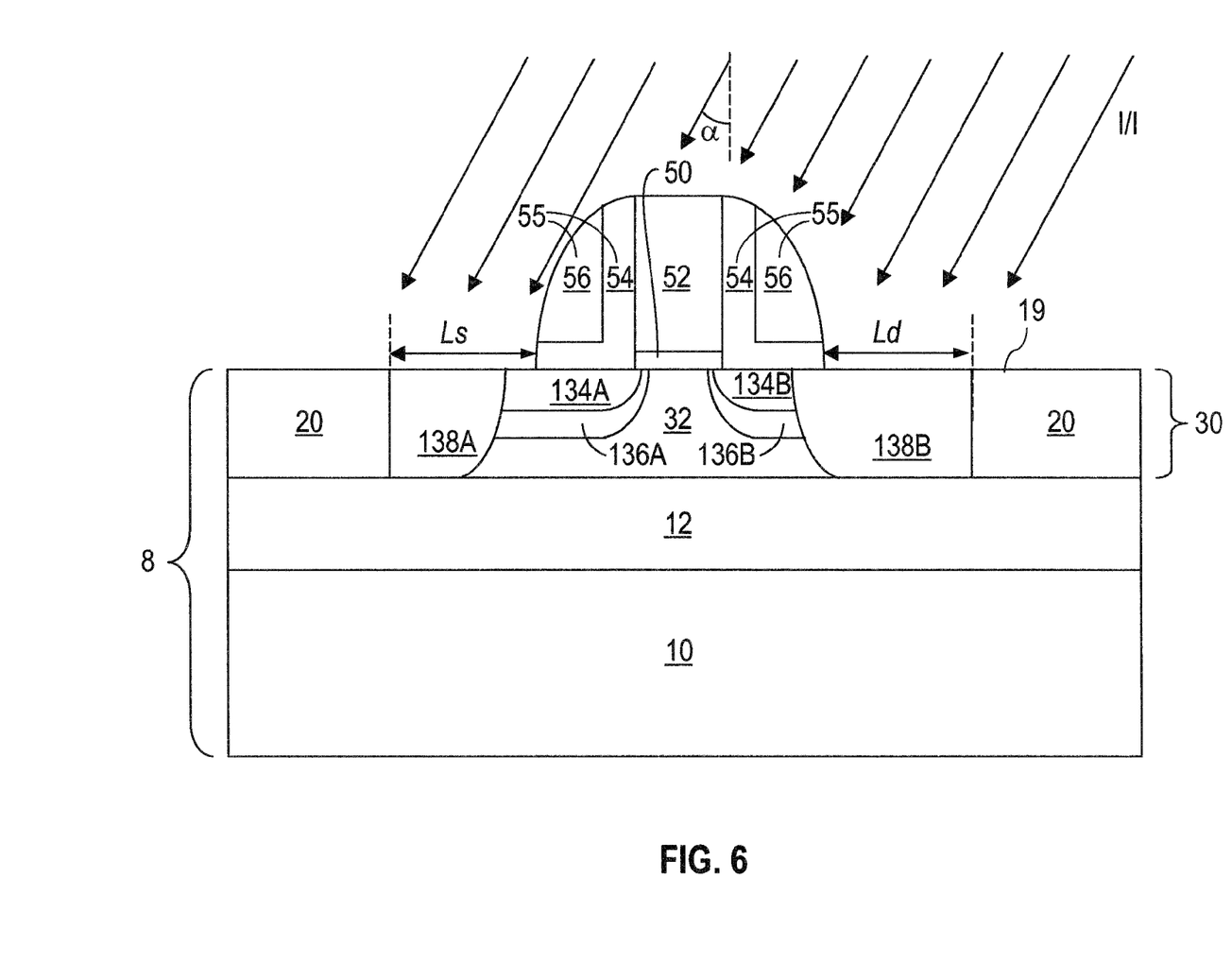

Referring to FIG. 6, an angled ion implantation is performed into portions of the top semiconductor layer 30 such that a portion of an exposed surface of the source extension region 134A is blocked from ions by the gate conductor 52 and the at least one gate spacer 55, while all of the exposed area of the drain extension region 134B is exposed to the ions. The direction of the ion implantation is represented by the arrows labeled I/I. The direction of the arrow may be confined within the plane of FIG. 6. The implanted ions are electrical dopant ions of the second conductivity type, i.e., has the same doping type as the source extension region 134 and the drain extension region 134B. A contiguous implanted region including implanted regions of the source extension region 134A and the source side halo region 136A constitutes a deep source region 138A. Another contiguous implanted region including implanted regions of the drain extension region 134B and the drain side halo region 136B constitutes a deep drain region 138B.

It is noted that no additional mask is necessary for the angled ion implantation since the gate conductor 52 and the at least one gate spacer 55 are employed as an implantation mask. The tilt angle α of the ion implantation, i.e., the angle between a vertical line and the direction of the ion implantation may be from about 5 degrees to about 60 degrees, and preferably from about 15 degrees to about 30 degrees. The energy of the ion implantation exceeds the thickness of the top semiconductor layer 30 so that the deep source region 138A and the deep drain region 138B abut the buried insulator layer 12. The doping concentration of the deep source region 138A and the deep drain region 138B may be from about $3.0 \times 10^{19}$ atoms/cm$^3$ to about $3.0 \times 10^{21}$ atoms/cm$^3$, while lesser and greater doping concentrations are also contemplated herein.

The deep source region 138A and the deep drain region 138B are asymmetrical, i.e., separated from the center of the gate conductor 52 by different distances. The deep source region 138A is farther separated from the center of the gate conductor 52 than the deep drain region 138B. In one embodiment, a source side length Ls, which is the lateral distance between an outer edge of the deep source region 138A abutting the shallow trench isolation 20 and an outer edge of the at least one gate spacer 55 on the side of the deep source region 138A at the top surface 19 of the top semiconductor layer 30, may be substantially the same as a drain side length Ld, which is the lateral distance between an outer edge of the deep drain region 138B abutting the shallow trench isolation 20 and an outer edge of the at least one gate spacer 55 on the side of the deep drain region 138B at the top surface 19 of the top semiconductor layer 30. The source side length Ls and the drain side length Ld may be a minimal dimension required to form a metal contact to a silicide region.

The implanted ions in the exemplary semiconductor structure are then activated by thermal anneal using methods such as furnace anneal, rapid thermal spike anneal, laser anneal, flash anneal, or a combination of the above-mentioned annealing techniques.

Figure 7:
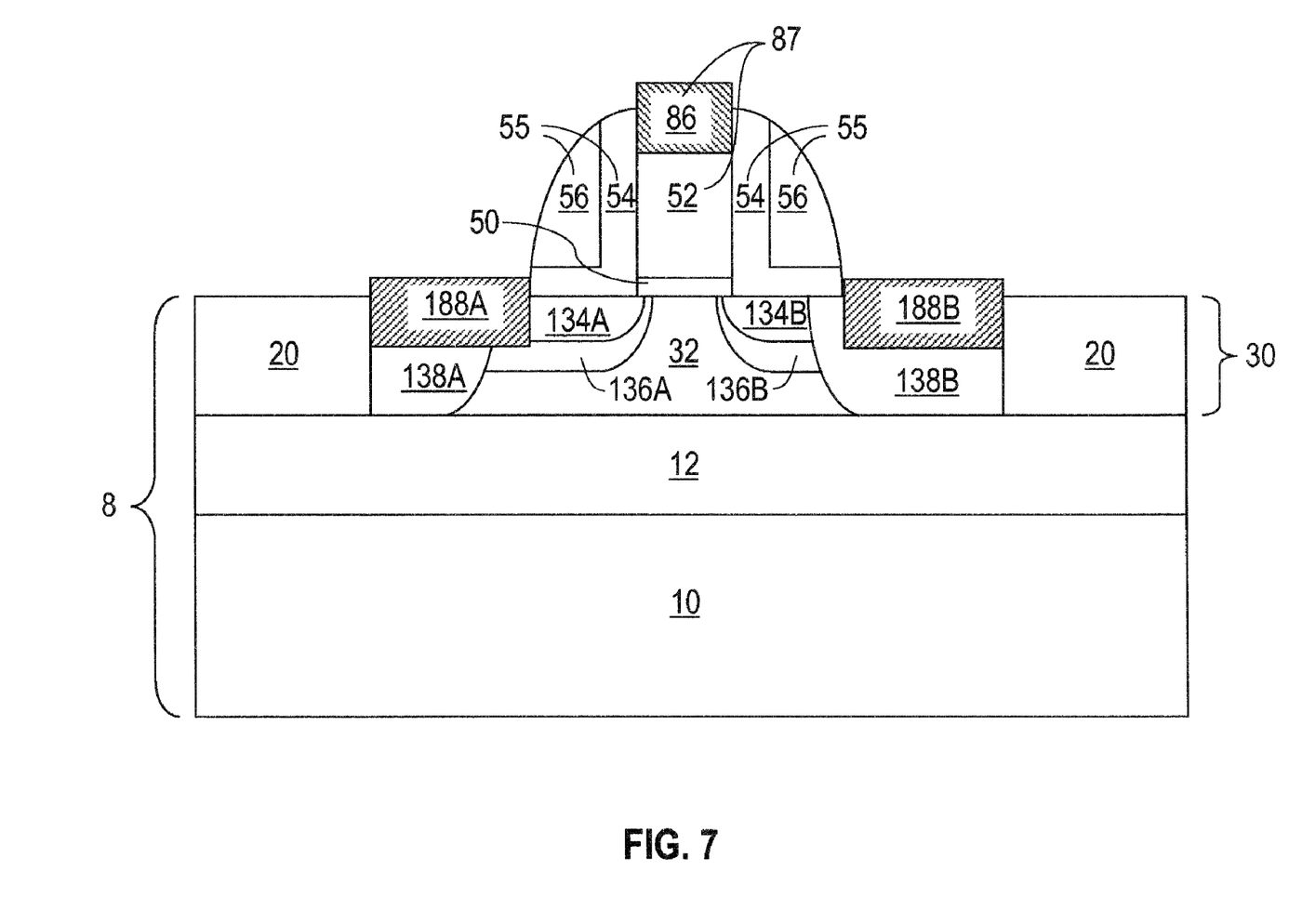

Referring to FIG. 7, a source metal semiconductor alloy 188A, a drain metal semiconductor alloy 188B, and a gate metal semiconductor alloy 86 are formed by metallization of exposed semiconductor material. To effect the metallization, a metal layer (not shown) may be deposited directly on the top semiconductor layer 30 and the gate conductor 52, for example, by a blanket deposition. The metal layer comprises a metal capable of forming a metal semiconductor alloy with the semiconductor material of the top semiconductor layer 30 and the semiconductor material of the gate conductor 52. For example, the metal may be tungsten, tantalum, titanium, cobalt, nickel, platinum, osmium, another elemental metal, or an alloy thereof.

A preferred thickness of the metal layer ranges from about 5 nm to about 50 nm, more preferably from about 10 nm to about 25 nm. The metal layer can be readily deposited by any suitable deposition technique, including, but not limited to: atomic layer deposition (ALD), chemical vapor deposition (CVD), and physical vapor deposition (PVD). Optionally, a metal nitride capping layer (not shown) may be deposited over the metal layer. The metal nitride capping layer may contain a refractory metal nitride such as TaN, TiN, OsN and has a thickness ranging from about 5 nm to about 50 nm, preferably from about 10 nm to about 30 nm.

The exemplary semiconductor structure is thereafter annealed at a predetermined elevated temperature at which the metal layer reacts with the semiconductor material of the top semiconductor layer 30 to form the source metal semiconductor alloy 188A directly on the deep source region 138A and the drain metal semiconductor alloy 188B directly on the deep drain region 138B. The source metal semiconductor alloy 188A and the drain metal semiconductor alloy 188B comprise the same metal semiconductor alloy material, i.e., have the same composition. Further, the metal layer reacts with the semiconductor material of the gate conductor 52 to form the gate metal semiconductor alloy 86. The gate metal semiconductor alloy 86 and the source metal semiconductor alloy 188A and the drain metal semiconductor alloy 188B are derived from the same metal, i.e., the metal of the metal layer employed in the metallization process.

The annealing is typically performed in an inert gas atmosphere, e.g., He, Ar, $N_2$, or forming gas, at a temperature that is conducive to formation of a first metal semiconductor alloy. Typically, the first metal semiconductor alloy is formed at relatively low temperatures compared with the temperatures for formation of a second metal semiconductor alloy, which is avoided at this stage. The temperature for formation of the first metal semiconductor alloy depends on the first metal semiconductor alloy, and ranges from about 100° C. to about 600° C., typically from about 300° C. to about 500° C., and most typically from about 300° C. to about 450° C. A continuous heating at a constant temperature or various ramping in temperature may be employed.

Due to volume expansion during the metallization process, top surfaces of the source metal semiconductor alloy 188A and the drain metal semiconductor alloy 188B may be located above top surfaces of the shallow trench isolation 20. After the metallization process, unreacted portions of the metal layer are removed, for example, by a selective wet etch.

Optionally but preferably, a second anneal may be performed to change the first metal semiconductor alloy into the second metal semiconductor alloy. The second metal semiconductor alloy has a more semiconductor rich phase. The resistivity of the various metal semiconductor alloys (138A, 138B, 86) is reduced by the transformation of the first metal semiconductor alloy into the second metal semiconductor alloy. In the first exemplary case, a metal silicide having a $Ni_2Si$ phase may be further annealed to form a NiSi phase. In the second exemplary case, a metal silicide having an OsSi phase may be further annealed to form an $Os_2Si_3$ phase. In the third exemplary case, a metal silicide having a CoSi phase may be further annealed to form a $CoSi_2$ phase. In the fourth exemplary case, a metal silicide having a TiSi phase may be further annealed to form a $TiSi_2$ phase. Similar phase transformations may be performed on other metal suicides, metal germanides, or other metal semiconductor alloys.

The vertical thickness of the source metal semiconductor alloy 188A and the drain metal semiconductor alloy 188B may be from about 10 nm to about 60 nm, and typically from about 20 nm to about 40 nm, although lesser and greater thicknesses are also contemplated. The gate metal semiconductor alloy 86 has a comparable thickness.

The source metal semiconductor alloy 188A vertically abuts the deep source region 138, the source side halo region 136A, and the source extension region 134A. In contrast, the drain metal semiconductor alloy 188B vertically abuts the deep drain region 138B, but not the drain side halo region 136B or the drain extension region 134B. The drain side halo region 136B and the drain extension region 134B are disjoined from the drain metal semiconductor alloy 188B.

The body 32 of the inventive SOI MOSFET structure is electrically tied to the deep source region 138A through the source side halo region 136A and the source metal semiconductor alloy 188A. Thus, the electrical potential of the body 32 is substantially the same as the electrical potential of the deep source region 138A, and floating body effect is eliminated or substantially reduced. The gate conductor 52 and the gate metal semiconductor alloy 86 collectively comprise a gate electrode 87.

Figure 8:
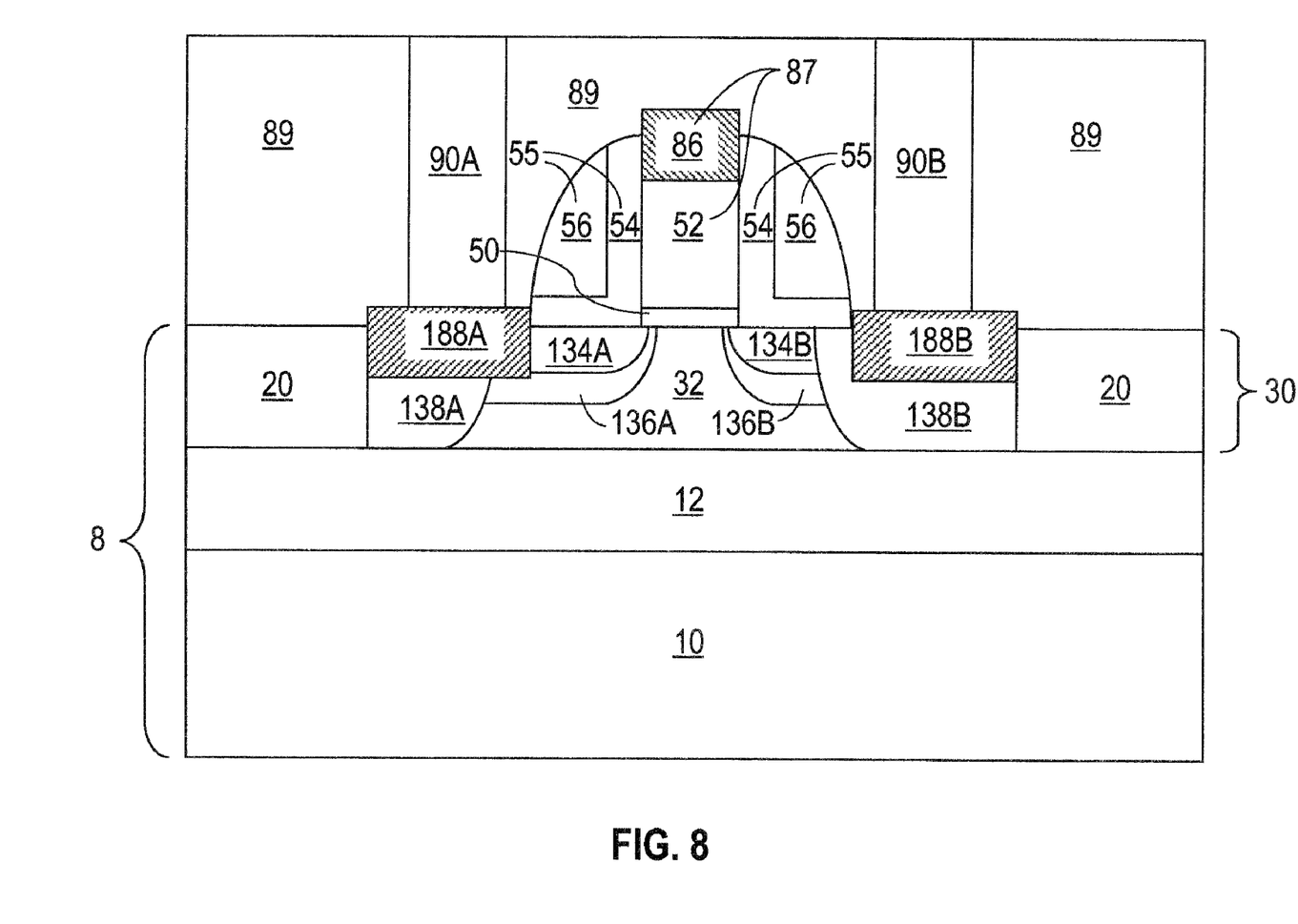

Referring to FIG. 8, a middle-of-line (MOL) dielectric layer 89 is formed on the gate electrode 87, the at least one gate spacer 55, the source metal semiconductor alloy 188A, the drain metal semiconductor alloy 188B, and the shallow trench isolation 20. The MOL dielectric layer 89 may comprise a silicon oxide, a silicon nitride, a chemical vapor deposition (CVD) low-k dielectric material, a spin-on low-k dielectric material, or a stack thereof. The MOL dielectric layer 89 may contain a mobile ion diffusion barrier layer that prevents diffusion of mobile ions such as sodium and potassium from back-end-of-line (BEOL) dielectric layers. Further, the MOL dielectric layer 89 may contain a stress liner that applies tensile or compressive stress on underlying structures to alter charge carrier mobility in a portion of the top semiconductor layer such as a channel (not shown) in the body 32 of the inventive SOI MOSFET.

Non-limiting examples of the silicon oxide include undoped silicate glass (USG), borosilicate glass (BSG), phosphosilicate glass (PSG), borophosphosilicate glass (BPSG), fluorosilicate glass (FSG), and TEOS (tetra-ethyl-ortho-silicate) oxide. The silicon nitride may be a stoichiometric nitride, or a non stoichiometric nitride applying a tensile or compressive stress to underlying structures.

Contact via holes are formed in the MOL dielectric layer 89 and filled with metal to form various metal contacts. Specifically, a source contact via 90A vertically abutting the source metal semiconductor alloy 188A and a drain contact via 90B vertically abutting the drain metal semiconductor alloy 188B may be formed.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A semiconductor structure comprising:
   a semiconductor-on-insulator (SOI) substrate including a handle substrate, a buried insulator layer, and a top semiconductor layer;
   a gate electrode located on said top semiconductor layer;
   at least one gate spacer laterally in direct contact with said gate electrode and vertically in direct contact with said top semiconductor layer;
   a deep source region vertically in direct contact with said buried insulator layer and laterally offset from an outer edge of said at least one gate spacer away from said gate electrode;
   a source side halo region located within said top semiconductor layer and in direct contact with said deep source region; and
   a source metal semiconductor alloy vertically in direct contact with said deep source region and said source side halo region.

2. The semiconductor structure of claim 1, wherein said source side halo region is not in direct contact with said buried insulator layer.

3. The semiconductor structure of claim 1, further comprising a source extension region located in said top semiconductor layer and in direct contact with said at least one gate spacer, said source side halo region, said deep source region, and said source metal semiconductor alloy.

4. The semiconductor structure of claim 1, wherein said top semiconductor layer comprises silicon and said source metal semiconductor alloy comprises a metal silicide.

5. The semiconductor structure of claim 1, further comprising:
   a deep drain region vertically in direct contact with said buried insulator layer and in direct contact with said at least one gate spacer;
   a drain side halo region located within said top semiconductor layer and in direct contact with said deep drain region; and
   a drain metal semiconductor alloy vertically in direct contact with said deep drain region and disjoined from said drain side halo region.

6. The semiconductor structure of claim 5, further comprising a drain extension region located in said top semiconductor layer and in direct contact with said at least one gate spacer, said drain side halo region, and said deep drain region and disjoined from said drain metal semiconductor alloy.

7. The semiconductor structure of claim 6, further comprising a gate dielectric in direct contact with said gate electrode, said gate spacer, said source extension region, said gate extension region, said source side halo region, and said deep drain side halo region.

8. The semiconductor structure of claim 5, wherein said gate electrode comprises a gate metal semiconductor alloy, wherein said source metal semiconductor alloy and said drain metal semiconductor alloy have the same composition, and said gate metal semiconductor alloy, said source metal semiconductor alloy, and said drain metal semiconductor alloy are metal semiconductor alloys derived from the same metal.

9. The semiconductor structure of claim 1, further comprising a body located in said top semiconductor layer, being in direct contact with said buried insulator layer, and having a first conductivity type doping at a doping concentration from about $1.0 \times 10^{15}$ atoms/cm$^3$ to about $1.0 \times 10^{19}$/cm$^3$, wherein said deep source region has a second conductivity type doping at a doping concentration from about $3.0 \times 10^{19}$ atoms/cm$^3$ to about $3.0 \times 10^{21}$ atoms/cm$^3$, and said source side halo region has said first conductivity type doping at a doping concentration from about $1.0 \times 10^{17}$ atoms/cm$^3$ to about $1.0 \times 10^{20}$ atoms/cm$^3$, and wherein said second conductivity type is the opposite of said first conductivity type.

10. The semiconductor structure of claim 1, wherein said top semiconductor layer has a thickness from about 30 nm to about 200 nm, said source side halo region has a depth, as measured from a top surface of said top semiconductor layer, from about 20 nm to about 180 nm, and said source metal semiconductor alloy has a thickness from about 15 nm to about 60 nm.

11. A semiconductor-on-insulator (SOI) metal-oxide-semiconductor field effect transistor (MOSFET) structure, comprising:
   a semiconductor-on-insulator (SOI) substrate containing a handle substrate, a buried insulator layer, and a top semiconductor layer;
   a gate dielectric vertically in direct contact with a portion of said top semiconductor layer;
   a gate electrode vertically in direct contact with said gate dielectric;
   at least one gate spacer laterally in direct contact with said gate electrode and vertically in direct contact with said top semiconductor layer;
   a body located in said top semiconductor layer and vertically in direct contact with said gate dielectric and having a first conductivity type doping;
   a deep source region vertically in direct contact with said buried insulator layer, laterally offset from an outer edge of said at least one gate spacer away from said gate electrode, and having a second conductivity type doping, wherein said second conductivity type is the opposite of said first conductivity type;
   a deep drain region in direct contact with said buried insulator layer and said at least one gate spacer and having said second conductivity type doping;
   a source extension region located in said top semiconductor layer and in direct contact with said at least one gate spacer and disjoined from said deep source region and having said second conductivity type doping;
   a drain extension region located in said top semiconductor layer and in direct contact with said at least one gate spacer and said deep drain region and having said second conductivity type doping;
   a source side halo region located within said top semiconductor layer, in direct contact with said deep source region, said source extension region, said gate dielectric, and said body, and having said first conductivity type doping;
   a drain side halo region located within said top semiconductor layer, in direct contact with said deep drain region, said drain extension region, said gate dielectric, and said body, and having said first conductivity type doping;

a source metal semiconductor alloy in direct contact with said deep source region, said source side halo region, and said source extension region; and a drain metal semiconductor alloy in direct contact with said deep drain region and disjoined from said drain side halo region and said drain extension region.

12. The SOI MOSFET structure of claim 11, wherein said top semiconductor layer comprises silicon and each of said source metal semiconductor alloy and said drain metal semiconductor alloy comprises a metal silicide.

13. The SOI MOSFET structure of claim 11, wherein said source side halo region is disjoined from said buried dielectric layer and said drain side halo region is disjoined from said buried dielectric layer.

14. The SOI MOSFET structure of claim 11, wherein said deep source region and said deep drain region have a doping concentration from about $3.0 \times 10^{19}$ atoms/cm$^3$ to about $3.0 \times 10^{21}$ atoms/cm$^3$, said body has a doping concentration from about $1.0 \times 10^{15}$ atoms/cm$^3$ to about $1.0 \times 10^{19}$ atoms/cm$^3$, and said source side halo region and said drain side halo region have a doping concentration from about $1.0 \times 10^{17}$ atoms/cm$^3$ to about $1.0 \times 10^{20}$ atoms/cm$^3$.

* * * * *